United States Patent [19]

Hawkins et al.

[11] Patent Number: 4,947,192

[45] Date of Patent: Aug. 7, 1990

[54] MONOLITHIC SILICON INTEGRATED CIRCUIT CHIP FOR A THERMAL INK JET PRINTER

[75] Inventors: William G. Hawkins, Webster; Cathie J. Burke, Brighton, both of N.Y.

[73] Assignee: Xerox Corporation, Stamford, Conn.

[21] Appl. No.: 336,624

[22] Filed: Apr. 7, 1989

Related U.S. Application Data

[63] Continuation of Ser. No. 164,669, Mar. 7, 1988, abandoned.

[51] Int. Cl.$^5$ ............................................. B41J 2/05
[52] U.S. Cl. ................................. 346/140 R; 357/59
[58] Field of Search ........................... 346/140; 357/59

[56] References Cited

U.S. PATENT DOCUMENTS

| | | | |
|---|---|---|---|
| 4,110,776 | 8/1978 | Rao et al. | 357/59 F |
| 4,251,824 | 2/1981 | Hara et al. | 346/140 |
| 4,308,549 | 12/1981 | Yeh | 357/238 |
| 4,399,451 | 8/1983 | Shirai | 357/59 F |
| 4,410,899 | 10/1983 | Haruta et al. | 346/140 R |
| 4,412,224 | 10/1983 | Sugitani | 346/1.1 |
| 4,429,321 | 1/1984 | Matsumoto | 346/140 |
| 4,463,359 | 7/1984 | Ayata et al. | 346/1.1 |
| 4,532,530 | 7/1985 | Hawkins | 346/140 |
| 4,595,821 | 6/1986 | Matsuura | 219/216 |
| 4,601,777 | 7/1986 | Hawkins et al. | 156/626 |
| 4,719,477 | 1/1988 | Hess | 346/140 |

OTHER PUBLICATIONS

Martin et al, IEEE IEDM, Dec. 1984, pp. 266–269.
Yamaguchi et al, IEEE IEDM, Dec. 1981, pp. 255–258.

*Primary Examiner*—Joseph W. Hartary

[57] ABSTRACT

A thermal jet ink printing system is provided with an inproved printhead. The printhead is formed by monolithic integration of MOS transistors switches onto the same silicon substrate containing the resistive elements. In a preferred embodiment, the transistor switches and resistive elements are formed from a single layer of polysilicon with the resistive element formed on a thermally grown field oxide layer having a thickness ranging from about one to four microns. The integrated circuit chips are formed by MOS technology, are thermally stable and can be operated at higher voltages.

4 Claims, 5 Drawing Sheets

MONOLITHIC SILICON INTEGRATED CIRCUIT CHIP FOR A THERMAL INK JET PRINTER

This is a continuation, of application Ser. No. 07/164,669, filed Mar. 7, 1988 now abandoned.

BACKGROUND AND INFORMATION DISCLOSURE STATEMENT

This invention relates to bubble ink jet printing systems and, more particularly, to an integrated circuit chip which contains active driver, logic and resistive heater elements.

Thermal ink jet printers are well known in the prior art as exemplified by U.S. Pat. Nos. 4,463,359 and 4,601,777. In the systems disclosed in these patents, a thermal printhead comprises one or more ink filled channels communicating with a relatively small ink supply chamber at one end and having an opening at the opposite end, referred to as a nozzle. A plurality of thermal energy generators, usually resistors, are located in the channels at a predetermined distance from the nozzle. The resistors are individually addressed with a current pulse to momentarily vaporize the ink and form a bubble which expells an ink droplet. As the bubble grows, the ink bulges from the nozzle and is contained by the surface tension of the ink as a meniscus. As the bubble begins to collapse, the ink still in the channel between the nozzle and bubble starts to move towards the collapsing bubble, causing a volumetric contraction of the ink at the nozzle and resulting in the separating of the bulging ink as a droplet. The acceleration of the ink out of the nozzle while the bubble is growing provides the momentum and velocity of the droplet in a substantially straight line direction towards a recording medium, such as paper.

In order to generate the resistor current pulses, some type of active drive device must be employed. Preferably, the drive circuitry should be formed on the same chip as the resistive elements. Prior art printheads use transistors having both positive and negative charge carriers (bipolar circuitry). Examples of printheads using bipolar drive circuits combined on the same chip as the resistors are provided in U.S. Pat. Nos. 4,251,824, 4,410,899 and 4,412,224. The disadvantages of the bipolar drive circuit prior art devices is that they require an expensive manufacturing technique and that they provide an inefficient use of the thermal energy. If the printhead could be made more thermally efficient, then less expensive MOS type circuitry (N-MOS) can be used to drive the head instead of the more expensive bipolar circuitry. Additionally, bipolar transistors exhibit destructive thermal run away when switching high currents. It is, of course, desirable and cost effective to have a resistor structure which is immediately and simply integrated on the same wafer with MOS drive electronics, preferably without additional process steps.

Prior art devices which utilize MOS type circuitry are disclosed in U.S. Pat. Nos. 4,595,821 to Matsuera and 4,532,530 to Hawkins.

In the Matsuera patent, a thermal printhead is disclosed in which a CMOS control circuit is mounted on a ceramic substrate upon which is also mounted the resistor element. This configuration is not suitable for thermal ink jet printing applications. In the Hawkins patent, a thermal printhead is formed, as the FIG. 4A and 4B embodiments. A polycrystalline silicon is simultaneously used to form the resistor and the associated drive circuitry. This configuration requires that each resistor element be attached to a bonding pad by a separate utilization contact process. Factors such as cost, more limited reliability and ink jet chip parameter space required for a bonding pad associated with every resistor, are disadvantages for moderate and high speed printing applications and for printing at a density near or above 300 spi.

According to a first aspect of the present invention, a monolithic silicon semiconductor integrated chip incorporating both MOS transistor drivers and resistive heater elements is provided which is more reliable in operation and more compact than prior art devices. According to a second aspect of the invention, semiconductor NMOS fabrication techniques are improved so as to increase transistor driver breakdown voltage and to add thermal efficiency while decreasing chip size.

The present invention is therefore directed to an improved monolithic silicon integrated circuit chip for ink jet printing which incorporates MOS drive circuitry and resistive heater elements. More particularly, the invention relates to a monolithic silicon integrated circuit chip for use with a bubble jet ink printhead, said chip comprising a plurality of polysilicon gated MOS transistor switches electrically connected to a plurality of polysilicon resistive elements, said resistive elements formed on a thermally grown field oxide layer having a thickness ranging from about 1 to 4 microns.

DESCRIPTION OF THE INVENTION

Figure 1:
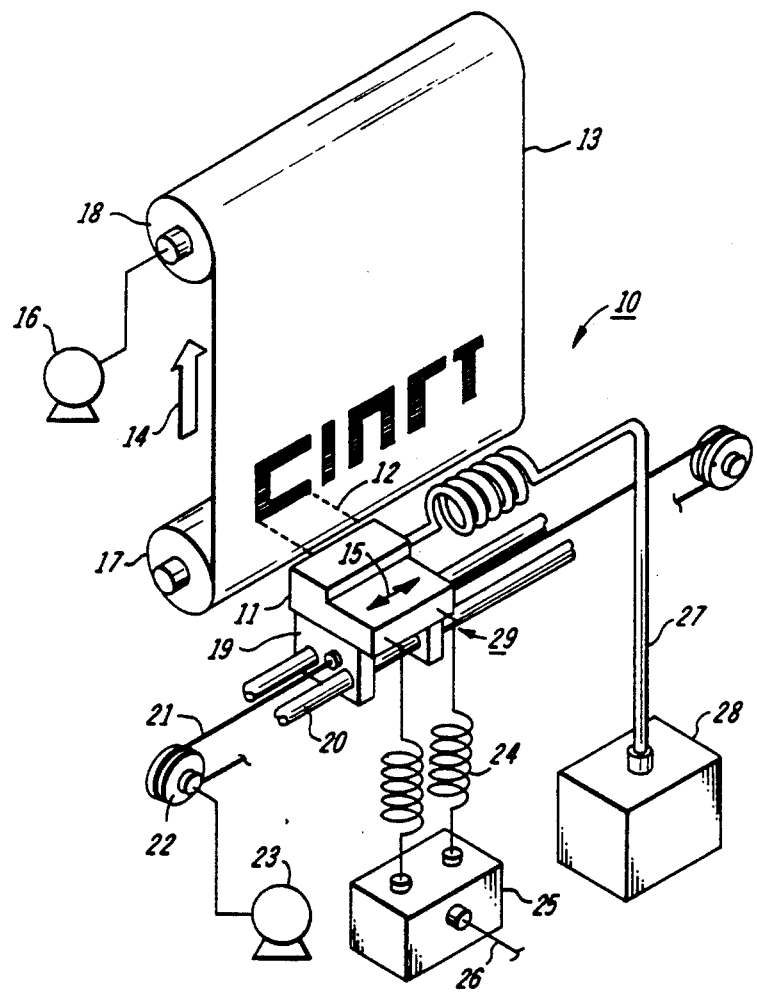
FIG. 1 is a schematic perspective view of a carriage type bubble jet ink printing system incorporating the present invention.

The printers which make use of thermal ink jet transducers can contain either stationary paper and a moving print head or a stationary pagewidth printhead with moving paper. A carriage type bubble jet ink printing device 10 is shown in FIG. 1. A linear array of droplet producing bubblejet channels is housed in the printing head 11 of reciprocating carriage assembly 29. Droplets 12 are propelled to the recording medium 13 which is stepped by stepper motor 16 a preselected distance in the direction of arrow 14 each time the printing head traverses in one direction across the recording medium in the direction of arrow 15. The recording medium, such as paper, is stored on supply roll 17 and stepped onto roll 18 by stepper motor 16 by means well known in the art.

The printing head 11 is fixedly mounted on support base 19 which is adapted for reciprocal movement by any well known means such as by two parallel guide rails 20. The printing head base comprise the reciprocating carriage assembly 29 which is moved back and forth across the recording medium in a direction parallel thereto and perpendicular to the direction in which the recording medium is stepped. The reciprocal movement of the head is achieved by a cable 21 and a pair of rotatable pulleys 22, one of which is powered by a reversible motor 23.

The current pulses are applied to the individual bubble generating resistors in each ink channel forming the array housed in the printing head 11 by connections 24 from a controller 25. The current pulses which produce the ink droplets are generated in response to digital data signals received by the controller through electrode 26. The ink channels are maintained full during operation via hose 27 from ink supply 28.

Figure 2:
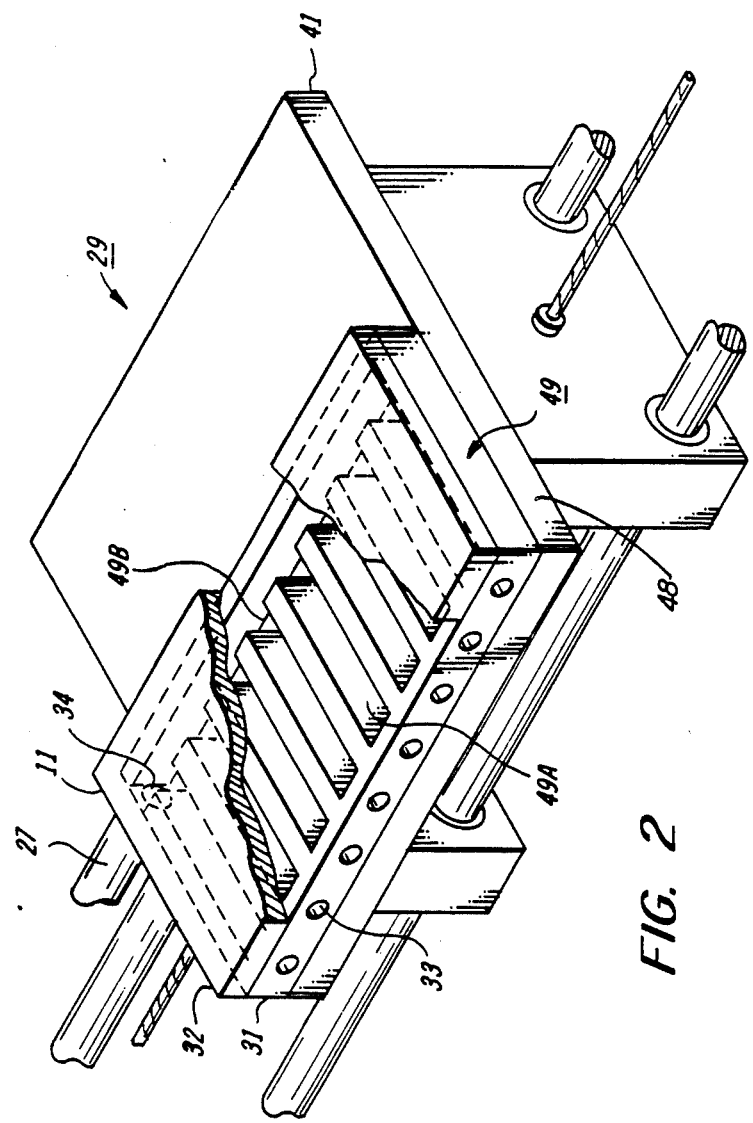
FIG. 2 is an enlarged schematic perspective view of the bubble jet ink printing head of FIG. 1.

FIG. 2 is an enlarged, partially sectioned, perspective schematic of the carriage assembly 29 shown in FIG. 1. The printing head 11 is shown in three parts. One part is the substrate 41 containing the electrical leads and monolithic silicon semi-conductor integrated circuit chip 48. The next two parts comprise the channel plate 49 having ink channels 49a and manifold 49b. Although the channel plate 49 is shown in two separate pieces 31 and 32, the channel plate could be an integral structure. The ink channels 49a and ink manifold 49b are formed in the channel plate piece 31 having nozzles 33 at the end of each ink channel opposite the end connecting the manifold 49b. The ink supply hose 27 is connected to the manifold 49b via a passageway 34 in channel plate piece 31 shown in dashed line. Channel plate piece 32 is a flat member to cover channel 49a and ink manifold 49b as they are appropriately aligned and fixedly mounted on silicon substrate.

Figure 3:
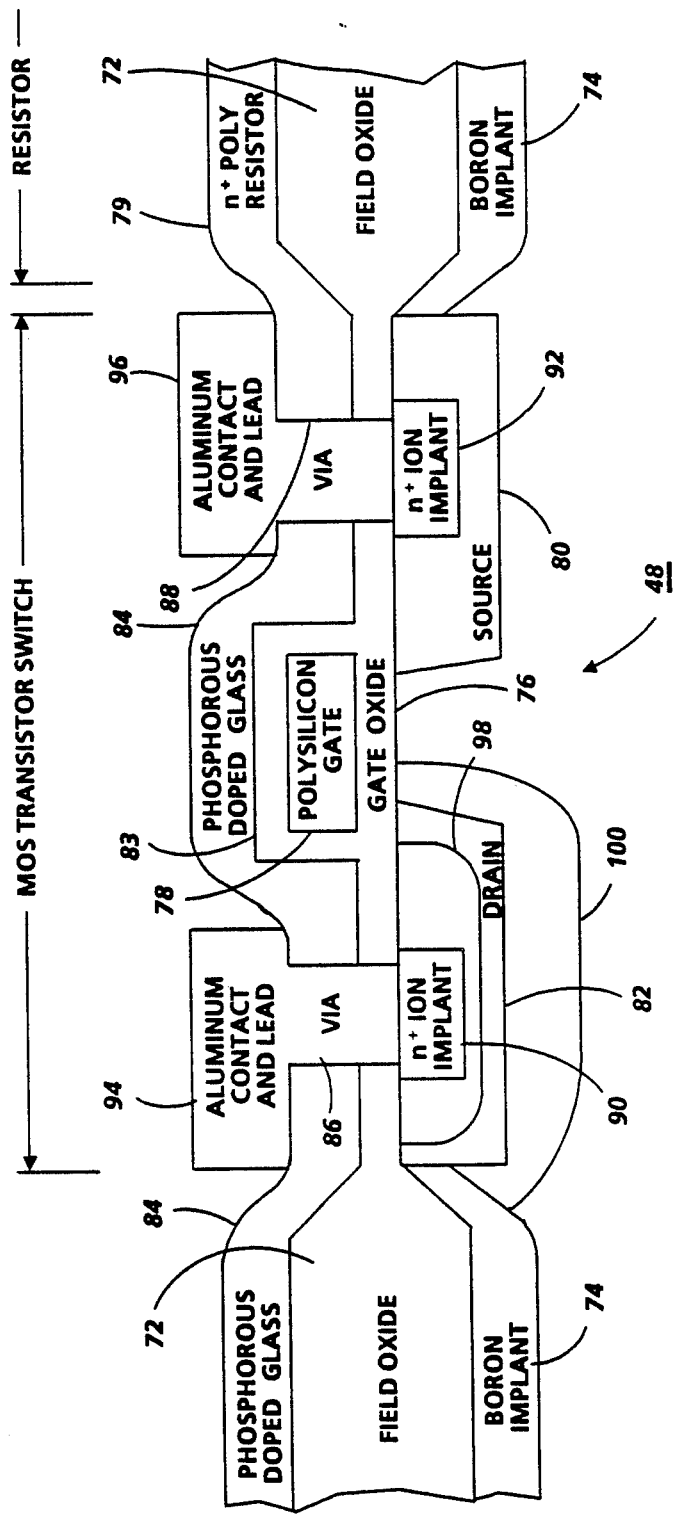
FIG. 3 is an enlarged, cross-sectional view of a first embodiment of the integrated circuit chip of the present invention.
Figure 4:
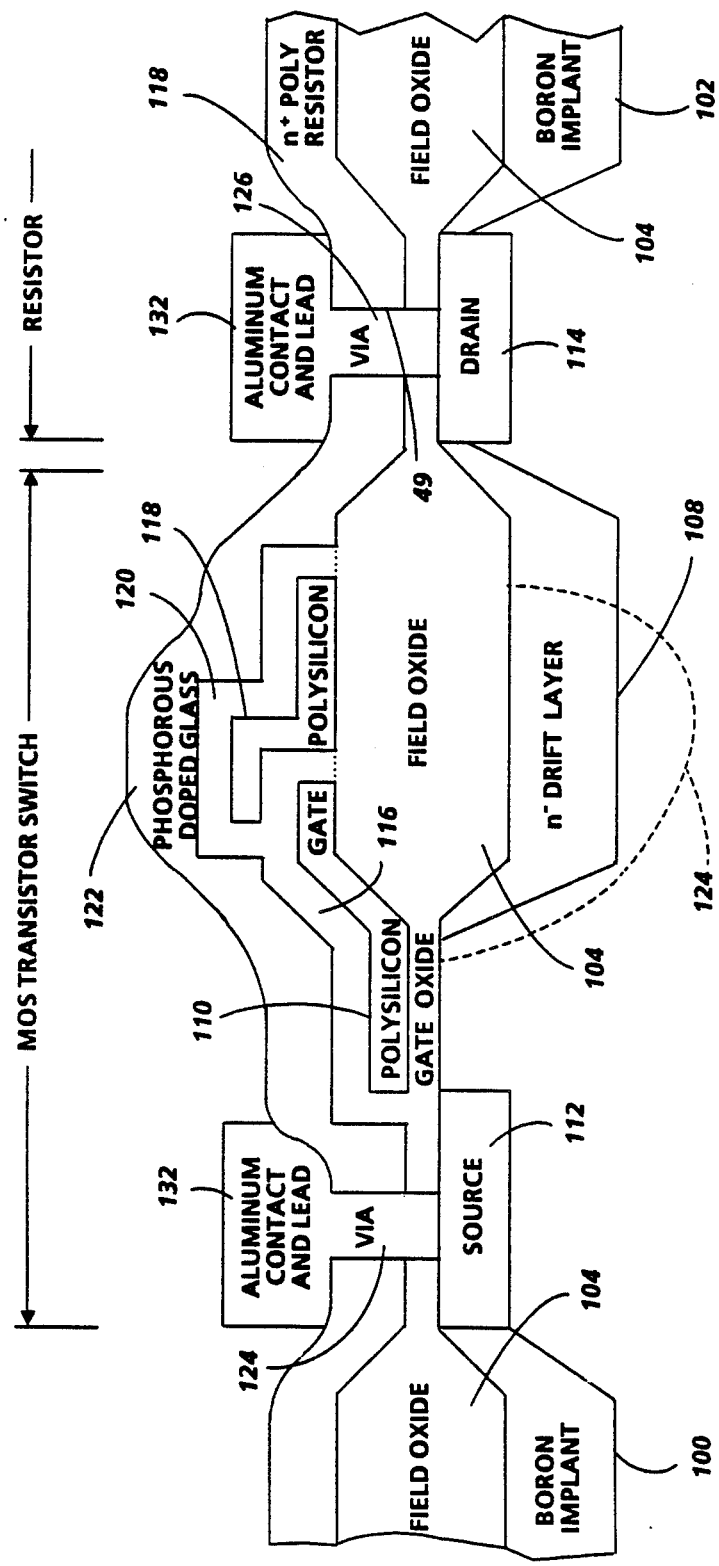
FIG. 4 is an enlarged, cross-sectional view of a second embodiment of the integrated circuit chip of the present invention.
Figure 5:
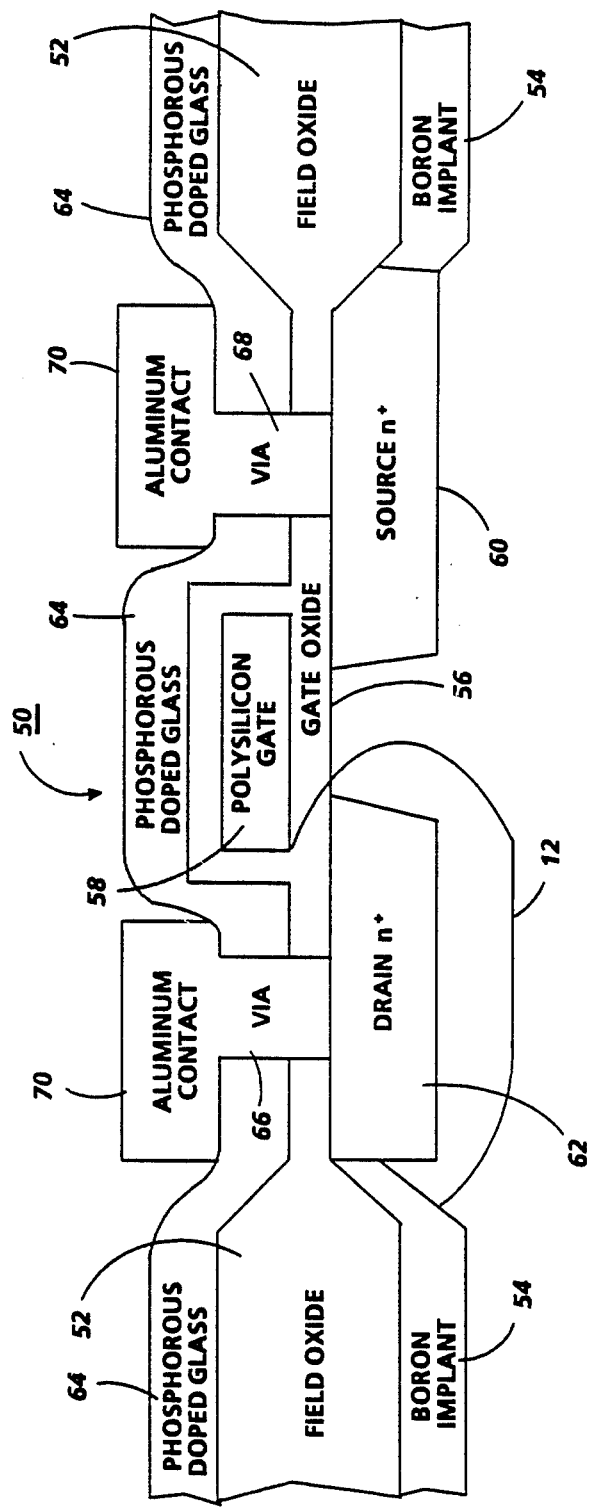
FIG. 5 is an enlarged, cross-sectional view of a prior art silicon logic integrated circuit.

The integrated circuit chip 48, shown in a first and second embodiment in FIG. 3 and 4, is formed, to some extent, according to standard NMOS process steps but modified in certain important respects. These modifications, discussed in full detail below, yield a compact and low cost circuit chip with increased thermal efficiency, and with higher breakdown voltages than prior art devices. In order to appreciate the process modification, a standard NMOS logic processing procedure used to fabricate silicon logic integrated circuits is reviewed in connection with fabrication of a prior art semiconductor transistor circuit shown in FIG. 5. Device 50, shown in cross-section, is formed by processing a p type silicon substrate wafer by the LOCOS (local oxidation of silicon) process to form a thin $SiO_2$ layer followed by deposition of a silicon nitride masking layer. A first photoresist layer is applied and patterned over the areas which will form the active enhancement and depletion mode device areas. The resist is first used to pattern the $Si_3N_4$ layer and then to block a channel stop boron implant from the active device areas. A channel stop boron implant 54 is aligned to the field oxide areas. The photoresist is then removed and the wafers are cleaned in a series of chemical solutions, and heated to a temperature of about 1000° C. Steam is flowed past the wafer to oxidize the surface for several hours. Silicon surfaces with $Si_3N_4$ present are not oxidized. The $Si_3N_4$ and pad $SiO_2$ are then removed to leave bare silicon in active areas and a thick isolation oxide (field oxide layers 52) elsewhere. The active devices are then selected to be depletion mode (normally on) or enhancement mode (normally off) by a second layer of patterned photoresist and ion implantation of an n-type silicon dopant. The resist is stripped and the wafer is cleaned and heated until a thin ($\leq$150 nm) gate oxide layer 56 is grown, typically in dry $O_2$, but optionally in steam. A boron threshold adjustment implant through the gate oxide then sets the threshold voltage of the enhancement mode devices. A polysilicon layer 58 is deposited, doped and patterned to form the device gate and provide additional interconnection. Resist is removed and heavily doped n+ source and drain regions 60 and 62, respectively, are formed adjacent to the gate layer 56 by ion implantation or diffusion. Following a cleaning procedure, the polysilicon and source-drain regions are re-oxidized and a phosphorous doped reflow glass is deposited and flowed at high temperature to planarize the surface topography to form layers 64. A fourth level of photoresist is then applied, patterned and etched to create vias 66 and 68 which allow contact to be made to the gate layer 56 and source and drain regions 60 and 62. Following a cleaning procedure, aluminum metalization is applied and patterned with a fifth layer of photoresist to form interconnections 70 to the drain and source as well as interconnecting various devices on the chip. An $SiO_2$ or $Si_3N_4$ low temperature layer is then applied and patterned to allow electrical interconnection of the chip. When a bias is applied to the drain of this device, a region around the drain area becomes depleted of carriers. As the bias continues to increase, breakdown will occur at the junction of the gate and the drain because of the high fields existing in the area.

FIG. 3 shows an active address chip 48 having an MOS transister switch monolithically integrated on the same substrate with the resistor. The chip is constructed by modifying techniques used to make the structure of FIG. 5, the modifications resulting in improved performance as will be seen. Considering FIG. 3, after the boron channel stop implant 74 is set, the field oxide layer 72 is grown at high temperature. According to a first aspect of the invention, the layer is at least 1 micron thick. Gate oxide layer 76 is grown in the power areas and a single polysilicon layer is deposited to form the transistor gates 78 and resistors 79. The polysilicon layer produces a sheet resistance between 5 $\Omega/\square$ and 5 $k\Omega/\square$. The polysilicon gates are used to mask ion implantation from the active transistor device channel area while a lightly doped source 80 and drain 82 implant is formed to produce a sheet resistance of between 500 $\Omega/\square$ and 20 $k\Omega/\square$ but, preferably, about 4 $k\Omega/\square$. The wafer is then cleaned and re-oxidized to form oxidized layer 83. A phosphorus doped glass layer 84 is then deposited on the thermal oxide layer 83 and is flowed at high temperatures in order to planarize the surface. Photoresist is applied and patterned to form vias 86 and 88 to drain 82 and source 80, respectively. According to a second aspect of the invention, the contact areas are heavily doped by n+ ion implants 90, 92 to allow ohmic contact between the lightly doped drain and source layers 82, 80 and aluminum metallization 94, 96. Following the thermal cycle necessary to activate the heavily doped regions 90, 92, the wafers are cleaned and aluminum metallization is applied to form interconnections 94, 96 thus providing contacts to the source, drain and polysilicon gate regions. In operation, as a bias is applied to the drain 82, the region around gate 78 becomes depleted of carriers into drain area 82, so that the edge of the depleted region looks similar to the boundaries outlined by lines 98, 100. Because the drain area becomes depleted, the electric field at the junction of gate 78 and drain implant 90 is less severe, so a high voltage can be tolerated before breakdown. By self-aligning the n-drift layer 82 to the polysilicon gate 78, breakdown voltage can be extended up to values greater than 75 volts, compared to a breakdown voltage of approximately 20 volts in the prior art device shown in FIG. 5. As shown in the following table, there is an inverse correlation between driver breakdown voltage and chip size. Chip size increases from 80 mils to 140 mils as the operating voltage decreases from 60 volts to 15 volts. As the size of an integrated circuit increases, manufacturing cost rises rapidly both because greater area of material is consumed and yield falls as size grows as well. Decreasing chip size from 140 mils to 80 mils by increasing breakdown voltage from 15 to 60 volts, at least halves the chip cost.

TABLE

| Voltage | Transistor | Length | Chip Size | Resistor |
|---|---|---|---|---|
| 15 | 84 × 2000 μm | 80 mils | 140 mils | 64 Ω |
| 30 | 84 × 1000 μm | 40 mils | 100 mils | 90 Ω |
| 45 | 84 × 750 μm | 30 mils | 90 mils | 127 Ω |
| 60 | 84 × 500 μm | 20 mils | 80 mils | 360 Ω |

As described above, field oxide layer 72 is grown so as to exceed a 1 micron thickness. In the standard NMOS process flow described above, field oxide regions ≦1.0 micron thick were grown on the surface of the silicon wafer in areas where transistors will not be formed. This thickness was sufficient to electrically isolate the individual transistors. In a thermal ink jet printing environment, a primary consideration is maintaining a thermally efficient heat dissipation from the resistor area. The resistors are typically heated by 2 μsec to 10 μsec electrical heating pulses. The energy required to eject an ink droplet suitable for a 300 spi printing system is 15 μjoules to 50 μjoules depending on the resistor design efficiency. With the resistor placed on top of the field oxide region, a thermally efficient resistor design will be one that provides low heat conduction from the resistor to the thermally conductive silicon substrate, thus reducing operating power requirements. It has been determined that a thermally efficient system is enabled by forming the oxide layer to a thickness of between 1-4 microns. For example, for 3 μsec heating pulses, the heat dissipation caused by heat flow from the resistor through the field oxide to the silicon substrate reaches a minimum where the field oxide layer is at least 2.0 microns thick. The upper level of the preferred oxide layer thickness range is limited by the field oxide and dopant encroachment into the active device area, the encroachment increasing superlinearly with oxide thickness. It has been determined experimentally that 5 μm wide enhancement mode NMOS devices have a ±5% or 100 mV device threshold shift compared to a 10 μm wide device. Therefore, it is easily possible to build a 5 μm gate NMOS logic with a 2.0 μm thick field oxide. Numerical calculations show that 3 μsec heating pulse thermal efficiency differences between 1.0 μm and 2.0 μm of thermal oxide is 21%, while a difference of 37% is found for 5 μsec pulses. Therefore, the oxide thickness of the thermal oxide must be adjusted to give optimum thermal efficiency for a selected pulse length.

Turning next to the third aspect of the invention discussed above in connection with the deposition of composite layer 79 over the resistors, it has been found that polysilicon resistors are damaged by bubble collapse caused by heating of the ink over the resistors. These devices fail after $10^6$ cycles which corresponds to less than 1000 pages of printing. Covering the resistors with layer 79 extends the operating life to $10^8$ cycles.

The FIG. 3 chip embodiment described above was fabricated so that a single level of polysilicon was used for both the gate of the driver transistor and for the resistive element. For some printing applications, it may be desirable to use two levels of polysilicon, one for the resistive elements and one for the gates of the driver transistors. FIG. 4 shows such a chip embodiment. For this embodiment, a boron channel stop implant forms more highly doped layers 100, 102 under the field oxide layer 104. Then, part of the silicon under the field oxide region is counter-doped with phosphorus to form a lightly doped n⁻ type drift layer 108. After these two implantation steps are carried out, the field oxide layers are grown to about a 2 micron thickness. The gate oxide growth process is followed by a deposition of a first layer 110 of polysilicon. After this layer is deposited, doped and delineated, the source 112 and drain 114 are formed by ion implantation or diffusion. The wafer is cleaned and a thermal oxide 116 is grown on the polysilicon, source and drain regions. A second polysilicon layer 118 is deposited, lightly doped and patterned to serve as the drift layer field plate and for the resistor elements on the adjacent field oxide region. An additional cleaning procedure is followed by thermal oxidation to form layer 120 and deposition of phosphorus doped flow glass to form layer 122. Photoresist is applied and patterned to allow vias 124, 126 to be formed to the source and drain diffusion 112, 114 as well as to the gate polysilicon 110 and drift layer field plate polysilicon 118. The wafer is then metallized to form interconnections 130, 132 providing contact to the source, drain and polysilicon region.

In operation, when voltage is applied to the drain, the drift layer 108 is pinched between the wafer, which is grounded, and the grounded field plate 118. Therefore, the drift layer 108 is depleted of carriers in the region 124 shown in the figure. As a consequence of being pinched off over a long distance, the device design is capable of switching very high voltages, depending only on the layout of the chip, and on the resistivity of the substrate. One advantage to this chip design is that by virtue of the high voltage switching capability, the effects of parasitic resistance created by metallization runs in front of the resistor or behind the nozzle is minimized since the parasitic effort of the common is proportional to current flow.

The two cases which have just been discussed demonstrate that drivers can be simultaneously fabricated with the resistive transducer elements. The presence of drivers alone allows reduction of interconnection from N connections to $\approx 2\sqrt{N}$ connections. For example, 50 jets can be addressed by $\approx 15$ connections, and 200 jets can be addressed by $\approx 30$ connections.

Addition of logic circuitry allows for a further reduction in interconnection which becomes important for large arrays. It is possible to address an arbitrarily large number of jets with six or seven electrical connections. NMOS logic circuits can be added by including depletion mode photoresist masking and implant process steps in the fabrication sequence so that normally on and normally off devices are available to form logic gates. The polysilicon which is used to form the resistor elements and gates of drivers is simultaneously used to form the gates of the logic circuit elements.

While it is preferable to fabricate the logic gates with NMOS technology because of it's simplicity and low cost, the use of CMOS logic technology is also a similar approach which could be used to form such circuits in a monolithic fashion. Also, while the active devices have been formed on a field oxide layer, an insulating substrate such as sapphire may be applicable for some systems.

What is claimed is:

1. A thermal ink jet printing module comprising an ink channel structure with a plurality of nozzles at one end and an ink supply at the other end, said structure fixedly adjoined to
   an integrated circuit which contains driver logic and resistive ink heating elements formed on the surface of a common silicon wafer, said circuit comprising,
   a p-type silicon substrate with a patterned field oxide layer grown on said substrate, followed by gate oxide growth to form a gate oxide layer,
   at least one transistor switch having a source and drain region formed on said substrate surface said drain region comprising a lightly doped n-type drift region and an n+ ion implanted region laterally displaced from the drift region, said transistor switch having an n−type polysilicon gate formed upon said gate oxide layer and in close physical proximity to said source and drain regions, and
   conductive vias contacting said source and drain regions at said n+ ion implanted region, said vias providing electrical connection between said transistor switch and said resistive elements whereby said n+ ion implanted region in at least the drain region creates a carrier depletion region upon application of input signals to the vias resulting in a reduction in the electric field at the gate-drain p-n junction.

2. The module of claim 1, wherein the gate layer and resistive elements are formed by a single polysilicon layer deposition.

3. The module of claim 1 wherein a first layer of polysilicon is deposited to form the gate layer and a second layer of polysilicon is deposited to form the resistive elements.

4. The module of claim 3, wherein the first polysilicon layer forms a field plate for a carrier depletion layer created beneath the gate layer upon application of input signals to the vias.

* * * * *